United States Patent
Armschat et al.

(10) Patent No.: US 9,277,665 B2
(45) Date of Patent: Mar. 1, 2016

(54) HIGH-VOLTAGE INSTALLATION WITH A DESIRED BREAKING POINT

(75) Inventors: Christoph Armschat, Erlangen (DE); Christoph Beck, Nuremberg (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 7 days.

(21) Appl. No.: 14/360,085

(22) PCT Filed: Nov. 23, 2011

(86) PCT No.: PCT/EP2011/070818
§ 371 (c)(1),
(2), (4) Date: May 22, 2014

(87) PCT Pub. No.: WO2013/075741
PCT Pub. Date: May 30, 2013

(65) Prior Publication Data
US 2014/0313651 A1    Oct. 23, 2014

(51) Int. Cl.
*H02G 5/02*    (2006.01)
*H05K 7/00*    (2006.01)
*H02B 1/54*    (2006.01)

(52) U.S. Cl.
CPC ............... *H05K 7/00* (2013.01); *H02G 5/025* (2013.01); *H02B 1/54* (2013.01)

(58) Field of Classification Search
CPC ............. H05K 7/00; H02G 5/025; H02B 1/54
USPC .......................................... 174/137 R, 68.2
See application file for complete search history.

(56) References Cited

U.S. PATENT DOCUMENTS

| 3,023,990 | A  * | 3/1962  | Gunthel, Jr. | ............. 248/70 |
| 4,281,213 | A    | 7/1981  | Sciscione    |                     |
| 8,081,486 | B2 * | 12/2011 | Dorn         | ............. 361/776 |

FOREIGN PATENT DOCUMENTS

| DE | 890083 C    | 9/1953 |
| DE | 3300279 A1  | 7/1984 |

* cited by examiner

*Primary Examiner* — Dhirubhai R Patel
(74) *Attorney, Agent, or Firm* — Laurence Greenberg; Werner Stemer; Ralph Locher

(57) ABSTRACT

A material-saving, cost-efficient and simultaneously safe high-voltage system for energy transfer includes a busbar and at least one high-voltage device connected to the busbar by an electrically conductive connecting device or connector. The connecting device or connector has a predetermined breaking point which is constructed in such a manner that the predetermined breaking point will break if a predetermined force is exerted between the busbar and the high-voltage device.

7 Claims, 3 Drawing Sheets

HIGH-VOLTAGE INSTALLATION WITH A DESIRED BREAKING POINT

BACKGROUND OF THE INVENTION

Field of the Invention

The invention relates to a high-voltage installation for energy transmission comprising a busbar and at least one high-voltage device, which device or devices is/are connected to the busbar via electrically conductive connecting means.

In the field of high-voltage technology, it is conventional to meet demands placed on earthquake protection by virtue of providing a mechanical loadability which is as high as possible, with the result that forces up to a specific limit value can be absorbed safely. Mechanical breakages or falling high-voltage devices are avoided in this way.

However, the increase in the resistance to breakage and strength under loading is generally linked with an increase in the thickness of the material used. However, this results in heavy, space-consuming installations and high production costs. Furthermore, in the case of unpredicted events, for example in the case of an unusually severe earthquake, it is not possible to rule out the possibility of the predetermined limit values for the mechanical load ability being exceeded and, despite all safety measures being taken, breakage and therefore failure of the entire high-voltage installation taking place.

BRIEF SUMMARY OF THE INVENTION

The object of the invention therefore consists in providing a high-voltage installation of the type mentioned at the outset which saves on material, is inexpensive and at the same time is safe.

The invention achieves this object by virtue of the fact that the connecting means have a desired breaking point which is designed in such a way that, in the event of a predetermined force effect between the busbar and the high-voltage device, breaking of the desired breaking point takes place.

The invention is based on the concept of providing a high-voltage installation in terms of its connecting elements no longer with an overdimensioned material thickness with high safety factors. Operational exception cases, such as, for example, extreme wind loads or short circuits with high current forces in the main current-conducting conductors, only develop the maximum forces in specific physical arrangements and in the case of large support spacing's. In DC switch panels, short-circuit forces can even be ruled out virtually completely.

Within the scope of the invention, breakages or damage to materials of connecting elements between high-voltage devices are no longer completely ruled out. However, it is essential within the scope of the invention that, for example in the case of an earthquake and in the case of overloading and downfall of an upright high-voltage device, no domino effect is produced whereby the remaining high-voltage devices connected to the falling high-voltage device via the busbar are likewise damaged or even knocked down. Within the scope of the invention, this is avoided by desired breaking points which are formed in one or more connecting means.

Each desired breaking point is designed in such a way that a precisely calculated mechanical weakening of the connecting means is ensured which safely brings under control the forces occurring during operation of the installation. As a result of this mechanical weakening, mechanical breakage of the connecting means takes place at the desired breaking point of the associated connecting means in the case of a mechanical loading which exceeds the set limit values. The damaged high-voltage device is thus electrically isolated and mechanically separated from the busbar. Damage which arises as a result of an earthquake, for example, can be limited in this way. Owing to the breakage of the connecting means, the high-voltage device can fall without the entire high-voltage installation being carried along with it.

The high-voltage installation is advantageously an air-insulated high-voltage installation. Within the scope of the invention, it is particularly expedient if high-voltage devices which exceed a physical height of 4 meters are connected to the busbar via a connecting means which has a desired breaking point.

Expediently, the desired breaking point is realized by a portion of weakened material in the connecting means. A portion of weakened material is, for example, a notch or a cutout in the connecting means. However, the connecting means are also always used for the electrical connection between the high-voltage device and the busbar. In other words, they form part of the current path between the high-voltage device and the busbar. By virtue of the portion of weakened material, the cross section of the current path in this part of the conductor section is constricted. At the same time, however, the strength of the connecting means is reduced. If there is a pulse-like force effect which exceeds a previously fixed threshold value, the connecting means breaks open and separates components between which the forces are acting. Expediently, it separates a high-voltage device which is falling down, for example, as a result of an earthquake, for example, from a busbar, to which further high-voltage devices are connected.

In accordance with a development which is expedient in this regard, the portion of weakened material brings about a cross-sectional constriction of the current path which extends beyond a path length of less than 10 mm. In accordance with this expedient configuration of the invention, it is ensured that the additional heating as a result of $I^2R$ energy losses is negligibly small in areas with reduced cross sections. Furthermore, the adjoining regions of the connecting means provide sufficient cooling.

Expediently, the busbar has at least one flexible conductor and/or one rigid conductor. Both the flexible and the rigid conductor, which is a conduit, for example, can be air-insulated or gas-insulated. At least some high-voltage devices are connected either to the flexible conductor or else to the rigid, nonflexible conductor via the connecting means. The flexible conductor is a stranded conductor, for example.

In accordance with a preferred configuration of the invention, the connecting means comprise at least one clamping unit, which clamping units have a flange section for connection to the high-voltage device and a clamping section for connection to the busbar, wherein the desired breaking point is arranged between the flange section and the clamping section over the course of the force transfer. As a deviation from this, the connecting means comprise a fitting having in each case two flange sections or a clamping unit having two clamping sections.

In accordance with a development in this regard, at least one of the clamping units has a multipart design and the flange section is connected to the clamping section via a clamping connecting means, wherein the desired breaking point is formed on the clamping connecting means. An example of a clamping connecting means is a screw connection which has a screw with an external thread, which engages in an internal thread formed in the clamping section. The desired breaking point is provided as a material cutout in the screw. Instead of a screw connection, however, all other suitable clamping connecting means can be considered, wherein the desired breaking point in the form of a material cutout is provided in the clamping connecting means.

Furthermore, it is possible for at least one clamping unit to be formed integrally, wherein the flange section is integrally formed on a clamping section via a connecting section and the desired breaking point is formed in the connecting section. In the case of such an integral clamping unit, the connecting section can be notched retrospectively, for example, with the result that slots are formed in the connecting section.

BRIEF DESCRIPTION OF THE SEVERAL VIEWS OF THE DRAWING

Further expedient configurations and advantages of the invention are the subject matter of the description below relating to exemplary embodiments of the invention with reference to the figures in the drawing, wherein identical reference symbols refer to functionally identical component parts, and wherein.

DESCRIPTION OF THE INVENTION

Figure 1:
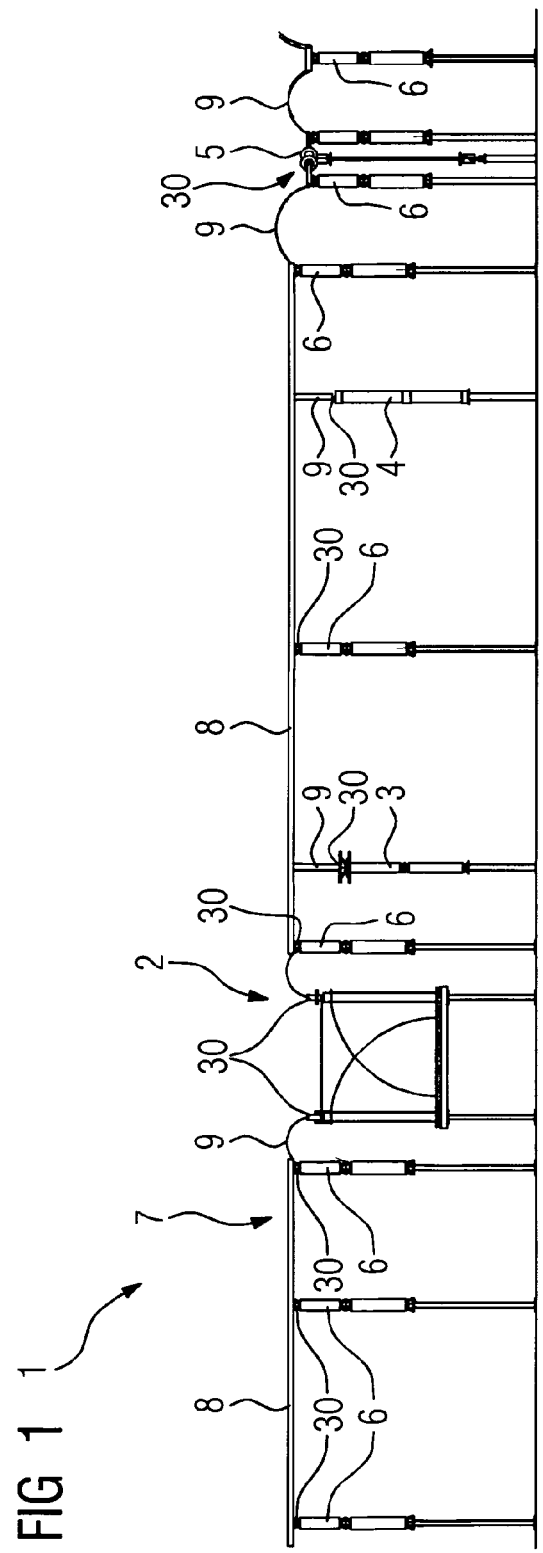
FIG. 1 shows an exemplary embodiment of the high-voltage installation in a side view.

FIG. 1 shows an exemplary embodiment of the high-voltage installation 1 according to the invention, which has a disconnector or a switch disconnector 2, an arrester 3, a capacitor 4, an ohmic resistor 5 and a series of post insulators 6 as high-voltage devices. Said high-voltage devices 2, 3, 4, 5 and 6 are connected electrically and mechanically to one another via a busbar 7, wherein the busbar 7 comprises a tubular conductor 8 as fixed conductor and a flexible conductor 9. Both the tubular conductor 8 and the flexible conductor 9 are air-insulated in this case. For the electrical and mechanical connection of the high-voltage devices 2, 3, 4, 5 and 6 to the busbars 7, connecting means in the form of electrically conductive connectors 30 are used which have a desired breaking point. Furthermore precise details will be given later in respect of the configuration of the connecting means or electrically conductive connectors 30. In the case of an earthquake, in particular in the case of high-voltage devices which protrude high upwards, for example above 2 meters, such as the arrester 3, for example, the outer ceramic hollow-body insulator or the composite insulator with glass-fiber-reinforced plastic pipe can break and therefore fall down. Owing to the flexible connection of the arrester 3, said arrester first covers a free fall path before the flexible conductor 9 tightens up and a force introduction takes place (possibly pulse-like force introduction) into the connecting means. Owing to this introduction of forces, the connecting means is caused to break, wherein the arrester 3 is disconnected from the busbar 9. The fall of the arrester 3 therefore does not have any effect on the remaining high-voltage devices 2, 4, 5 and 6.

Figure 2:
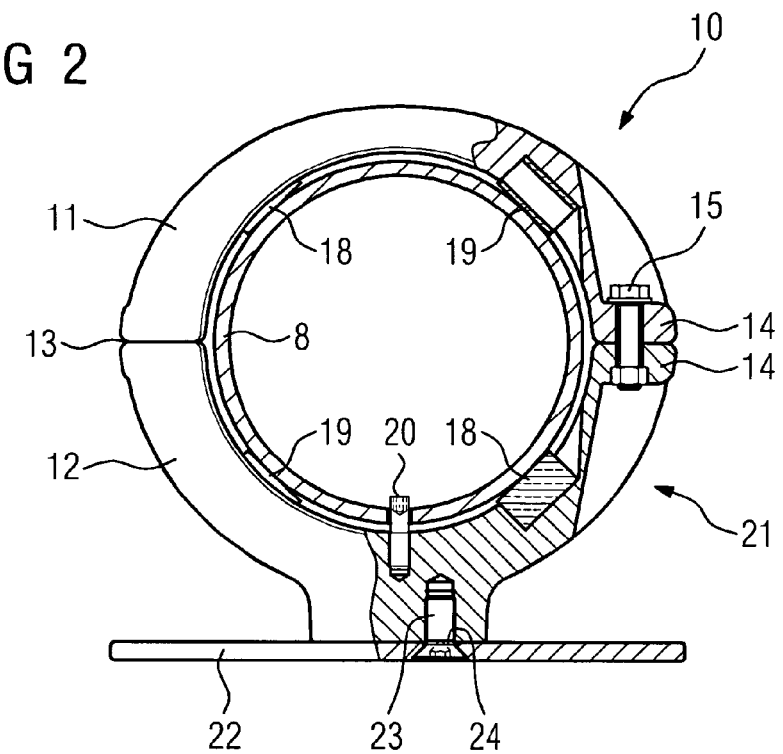
FIG. 2 shows an exemplary embodiment of a clamping unit in a partially sectioned front view.

FIG. 2 shows an exemplary embodiment of a clamping unit 10 as part of the connecting means or electrically conductive connectors 30 of a high-voltage installation 1 shown in FIG. 1. The clamping unit 10 has two half-shells 11 and 12, which are articulated on one another at a connecting point 13. The half-shells 11 and 12 each form a flange section 14 on that side of the clamping unit 10 which is opposite the connecting point 13, wherein the two flange sections 14 are fixedly connected to one another by means of a screw connection 15. In the closed state of the half-shells 11 and 12 in which they are not pivoted up, as is shown, said half-shells delimit a circular inner region, whose inner diameter corresponds to the outer diameter of the tubular conductor 8 of the busbar 7 to be accommodated. The half-shells 11 and 12 are manufactured from an electrically conductive material, for example copper or aluminum. In order to accommodate the tubular conductor 8 and its mechanically damped mounting, plastic bearings 18 and damping elements 19 are used, which are arranged in the half-shells 11 and 12, wherein they face the tubular conductor 8. Furthermore, the half-shell 12 is equipped with a pin-type connection 20, which extends through a through-opening in the tubular conductor 8. In this way, a mechanical connection of the tubular conductor 8 to the clamping unit 10, and vice versa, is ensured.

The clamping unit 10 has, in addition to the clamping section 21 formed by the half-shells 11 and 12, a flange section 22, with which the clamping unit 10 is fixedly connected to the post insulator 6. The flange section 22 in the exemplary embodiment shown in FIG. 2 has a circular configuration in a plan view (not shown) and has through-bores, which are arranged in annular fashion in the outer region of the flange section 22. With the aid of these through-openings, the clamping unit 10 can be screwed fixedly to the post insulator 6, for example, as shown in FIG. 1. For the connection between the flange section 22 and the clamping section 21, a screw 23 is used as clamping connecting means, which screw has a small lateral notch 24 as desired breaking point, in the exemplary embodiment shown. This notch 24 naturally provides a portion of weakened material, with the result that the mechanical strength of the screw is reduced in this region. As forces are introduced which exceed a predetermined limit value, breakage of the screw results and thus also disconnection of the mechanical connection between the post insulator 6 and the busbar 7. If the forces are also introduced in pulse-like fashion, the inertial mass of the device provides further protection even beyond the static bending loading capacity of the device.

Figure 3:
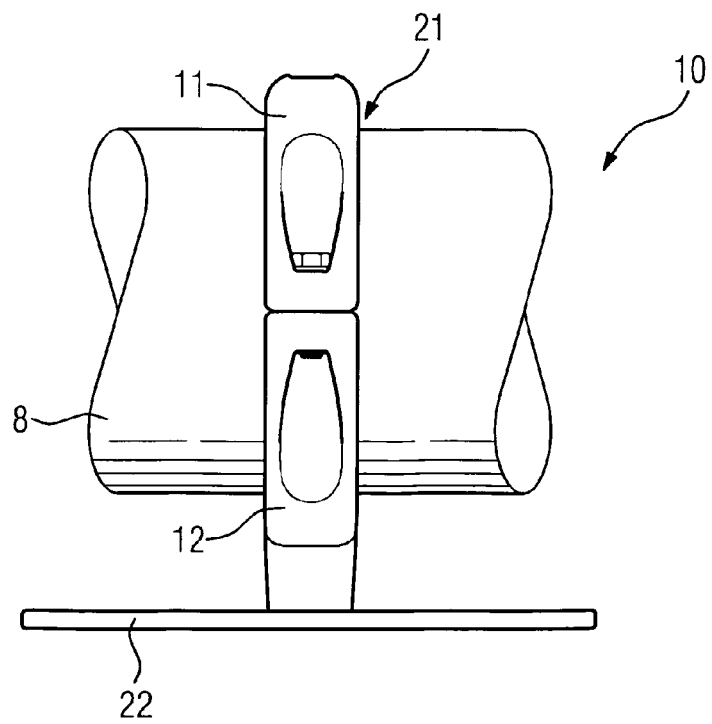
FIG. 3 shows the clamping unit shown in FIG. 2 in a side view.

FIG. 3 shows the clamping unit 10 shown in FIG. 2 in a side view. In particular, the tubular conductor 8 is readily visible.

Figure 4:
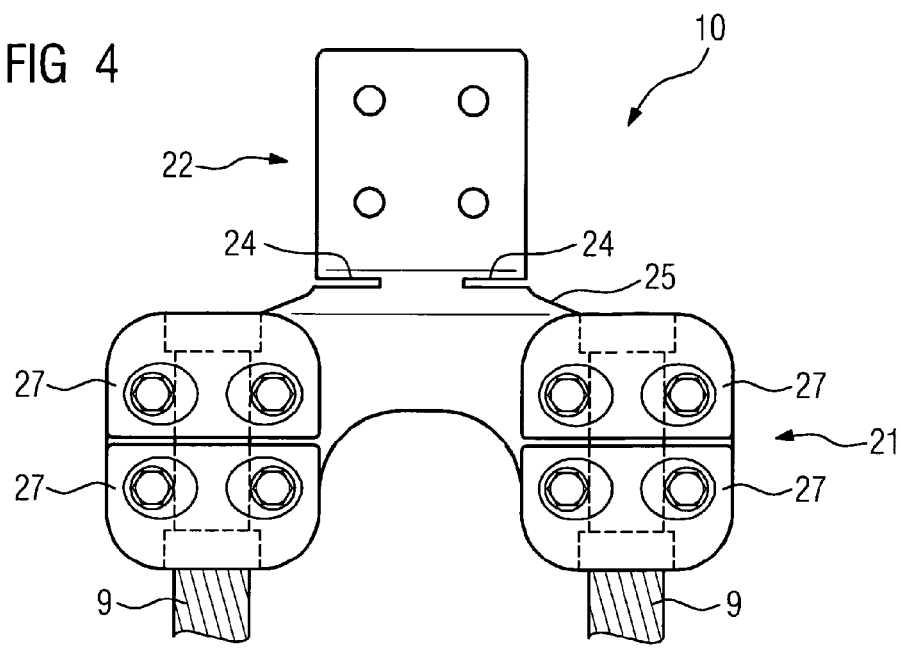
FIG. 4 shows a further exemplary embodiment of a clamping unit in a front view.

FIG. 4 shows a further exemplary embodiment of an integral clamping unit 10, which likewise again has a flange section 22 for the fixed connection to a high-voltage device and a clamping section 21, which is again used for the mechanical and electrical connection to a flexible conductor 9 of the busbar 7. A connecting section 25, in which notches 24 can be seen, extends between the clamping section 21 and the flange section 22. Owing to the notches 24, a cross-sectional constriction of the conductor track formed by the connecting section 25 is brought about, as a result of which a development of heat can result during operation of the high-voltage installation 1. During operation, a current driven by the high voltage flows between the flange section 22 and the clamping section 21, wherein the current path is routed via the connecting section 25. The cross-sectional area of this current path corresponds to the area which is enclosed by the contour of the connecting section 25 in the cross-sectional view. This conductor area is constricted by the notches 24, resulting in a slightly increased development of heat. However, owing to this portion of weakened material 24, mechanical weakening of the clamping section 10 and therefore a desired breaking point are provided. Since the portion of weakened material extends along the current path only over millimeters to a few centimeters, the resultant development of heat is moderate.

The configuration of the flange section 22 is known to a person skilled in the art (high-voltage connection terminal), with the result that no further details need to be provided in this regard. It should merely be mentioned that the flange section 22 forms a connecting lug, which has four through-bores. The through-bores are used for screwing the clamping unit 10 to the respective high-voltage device.

Figure 5:
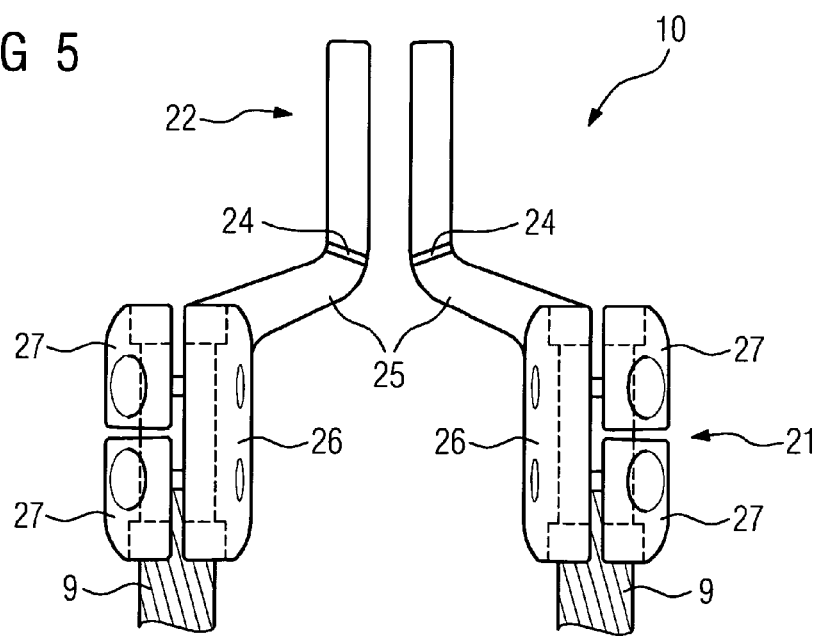
FIG. 5 shows the clamping unit shown in FIG. 4 in a side view.

It can be seen from FIG. 5 that the clamping section 21 has an abutment region 26, which is fixedly connected to the connecting section 25 and on which two half-shells 27 can be screwed. The free end of the flexible conductor 9 is arranged between the half-shells 27 and the abutment region 26. By means of screwing, the spacing between the abutments 27 and the abutment region 26 is reduced, as a result of which a clamping force and a retaining effect for retaining the flexible conductor 9 are provided.

The invention claimed is:

1. A high-voltage installation for energy transmission, the high-voltage installation comprising:
    a busbar;
    at least one high-voltage device; and
    an electrically conductive connector connecting said at least one high-voltage device to said busbar;
    said connector including at least one clamping unit having a flange section for connection to said at least one high-voltage device and a clamping section for connection to said busbar;
    said connector having a desired breaking point configured to break said desired breaking point upon an occurrence of a predetermined force effect between said busbar and said at least one high-voltage device, said desired breaking point being disposed between said flange section and said clamping section over a course of a force transfer.

2. The high-voltage installation according to claim 1, wherein said desired breaking point is a portion of weakened material in said connector.

3. The high-voltage installation according to claim 2, wherein said portion of weakened material brings about a cross-sectional constriction of a current path extending beyond a path length of less than 10 mm.

4. The high-voltage installation according to claim 1, wherein said busbar has at least one of at least one flexible conductor or at least one rigid conductor.

5. The high-voltage installation according to claim 1, wherein said at least one clamping unit has a multipart construction, a clamping connecting device connects said flange section to said clamping section, and said desired breaking point is formed on said clamping connecting device.

6. The high-voltage installation according to claim 5, wherein said at least one clamping unit has an integral construction with a connecting section integrally formed between said flange section and said clamping section, and said desired breaking point is formed in said connecting section.

7. The high-voltage installation according to claim 1, wherein said at least one clamping unit is formed in one-piece and has a connecting section formed between said flange section and said clamping section, and said desired breaking point is formed in said connecting section.

* * * * *